United States Patent [19]
Tomoyasu et al.

[11] Patent Number: 5,888,907
[45] Date of Patent: Mar. 30, 1999

[54] PLASMA PROCESSING METHOD

[75] Inventors: Masayuki Tomoyasu, Nirasaki; Shinji Himori, Yamanashi-ken, both of Japan

[73] Assignee: Tokyo Electron Limited, Tokyo, Japan

[21] Appl. No.: 842,426

[22] Filed: Apr. 24, 1997

[30] Foreign Application Priority Data

Apr. 26, 1996 [JP] Japan .................................. 8-130767

[51] Int. Cl.$^6$ .................................................. H01L 21/00
[52] U.S. Cl. .............................................. 438/714; 216/67
[58] Field of Search ........................... 118/715, 723 E, 118/723 R; 156/345; 204/298.07, 298.33; 438/714; 216/67

[56] References Cited

U.S. PATENT DOCUMENTS

| 4,993,358 | 2/1991 | Mahawili | 118/715 |
| 5,210,466 | 5/1993 | Collins et al. | 315/111.21 |
| 5,226,967 | 7/1993 | Chen et al. | 118/723 |
| 5,500,256 | 3/1996 | Watabe | 427/579 |
| 5,669,976 | 9/1997 | Yuuki et al. | 118/725 |

FOREIGN PATENT DOCUMENTS

| 60-189928 | 9/1985 | Japan . |
| 61-5515 | 1/1986 | Japan . |
| 62-262419 | 11/1987 | Japan . |
| 1-239086 | 9/1989 | Japan . |
| 3-22414 | 1/1991 | Japan . |

*Primary Examiner*—Bruce Breneman
*Assistant Examiner*—Luz Alejandro
*Attorney, Agent, or Firm*—Oblon, Spivak, McClelland, Maier & Neustadt, P.C.

[57] ABSTRACT

In a plasma etching apparatus, an inactive gas and a reactive gas are supplied from a gas spouting surface of a shower head, and are turned into plasma by means of RF discharge, so that a semiconductor wafer placed on a susceptor is etched by the plasma. The inactive gas is continuously supplied from inactive gas spouting holes formed all over the gas spouting surface. The reactive gas is supplied from reactive gas spouting holes, which are formed all over the gas spouting surface and divided into a plurality of groups, by repeatedly scanning the groups in a time-sharing manner.

5 Claims, 9 Drawing Sheets

PLASMA PROCESSING METHOD

BACKGROUND OF THE INVENTION

The present invention relates to a method and apparatus for subjecting a target object, such as a semiconductor wafer or LCD substrate, to a process, using plasma generated by means of radio frequency (RF) discharge, and in particular to a method and apparatus for subjecting a target object having a large surface area to plasma etching or plasma deposition at a high planar uniformity and a high processing rate.

In processes of manufacturing semiconductors, various kinds of plasma processes, such as etching, are performed on a target object, such as a semiconductor wafer, in a plasma atmosphere, while plasma is generated in a process chamber. In recent years, target objects of this kind have become higher in their diameter or surface area, such that, for example, semiconductor wafers have changed their size from 6 inches to 8 inches and further to 12 inches (300 mm), in order to decrease the processing cost per unit surface area of the target objects.

In consideration of this demand, researches have been conducted on plasma processing apparatuses for processing a target object of a large surface area. It is thought that, as a type of generating plasma used in such processing apparatuses, the parallel plate type or the ICP (Inductively Coupled Plasma) type is promising. This is because, the other types of generating plasma, such as the ECR (Electron Cyclotron Resonance) type and the helicon wave type, are apt to produce a plurality of modes, thereby bringing about a difficulty in obtaining uniform plasma, when a plasma source becomes large in accordance with a target object.

There is another problem caused due to a large magnet in these plasma processing apparatuses. In this case, where plasma is spread by means of diffusion due to gradient of a magnetic field without making a plasma source larger, electrons are accelerated at the peripheral region, thereby causing plasma properties to be different between the central region and the peripheral region.

Further, if a wafer larger than an 8-inch (200 mm) wafer needs to be provided with process properties, such as processing rate, selectivity, and processed shape, which are equal to those obtained relative to the 8-inch wafer, the flow rate of a process gas should be increased in proportion to an increase in the surface area of the target surface. In this case, where the height of a plasma space, i.e., the distance between upper and lower electrodes in the parallel plate type, is maintained to be equal to that of a conventional apparatus, the aspect ratio of the plasma space between its height and width becomes greater with an increase in the surface area of the target surface, thereby reducing its exhausting conductance. As a result, a high vacuum suitable for a plasma process is hardly obtained while causing a large predetermined amount of a processing gas to flow, in consideration of the performance of, e.g., a vacuum pump currently being used. For example, as compared with an 8-inch wafer, a 300-mm (12-inch) wafer increases its surface area 2.24 times larger, and thus requires a 2.24 times greater amount of processing gas, thereby bringing about a difficulty in vacuum exhaustion. Further, exhaustion of a reactive gas differs between the central and peripheral regions of the target surface, and thus process properties, such as a processing rate, are not uniform between the central and peripheral regions of the target surface.

It can be assumed that the exhausting conductance should be increased by expanding the distance between the electrodes so as to allow the vacuum exhaustion to be performed easily. In this case, however, if its dissociated gas state is to be the same as that in a conventional apparatus while preventing the plasma density from lowering, it is necessary to set the residence time of the gas in the plasma space to be also equal. As a result, the flowing amount of the gas has to be increased, thereby further bringing about a difficulty in vacuum exhaustion.

BRIEF SUMMARY OF THE INVENTION

The present invention has been made in light of the above described problems, and its object is to provide a plasma processing method and apparatus in which a target object having a large surface area can be subjected to a process at a high planar uniformity and a high rate, without increasing the exhausting performance of a vacuum pump currently being used.

The present inventors have conducted researches on methods of supplying a reactive gas in a plasma processing apparatus, and found the following knowledge to reach the present invention. Namely, even if the whole amount of gas supplied per unit time is decreased, it is possible to maintain a high planar uniformity of a plasma process, by continuously supplying an inactive gas for initiating and uniformly keeping plasma toward a target surface to keep a high plasma density, while supplying a reactive gas in a time-sharing manner among the local areas of the target surface.

According to a first aspect of the present invention, there is provided a plasma processing apparatus for processing a target object, using plasma, comprising:

an airtight process chamber;

a work table arranged in the process chamber for supporting the target object;

an exhaust for exhausting and setting the process chamber at a vacuum;

a shower head arranged in the process chamber and having a gas spouting surface facing the work table;

an inactive gas supply for supplying an inactive gas into the process chamber, the inactive gas supply having inactive gas spouting holes formed substantially all over the gas spouting surface;

a reactive gas supply for supplying a reactive gas into the process chamber, the reactive gas supply having reactive gas spouting holes formed substantially all over the gas spouting surface and divided into a plurality of groups, the reactive gas supply being arranged such that the groups of the reactive gas spouting holes are capable of supplying and stopping the reactive gas independently of each other;

an electric field generator for generating an electric field in the process chamber, the electric field being used for turning the inactive gas and the reactive gas into plasma by means of RF discharge; and a control section for controlling the reactive gas supply such that the groups of the reactive gas spouting holes are repeatedly scanned in a time-sharing manner to supply the reactive gas.

According to a second aspect of the present invention, there is provided a plasma processing apparatus for processing a semiconductor wafer having a diameter of 300 mm or more, using plasma, comprising:

an airtight process chamber;

a work table arranged in the process chamber for supporting the target object;

an exhaust for exhausting and setting the process chamber at a vacuum;

a shower head arranged in the process chamber and having a gas spouting surface facing the work table;

a process gas supply for supplying a process gas into the process chamber, the process gas supply having process gas spouting holes formed substantially all over the gas spouting surface; and an electric field generator for generating an electric field in the process chamber, the electric field being used for turning the process gas into plasma by means of RF discharge, the electric field generator comprising first and second electrodes incorporated with the work table and the shower head, respectively, and an RF power supply connected to at least one of the first and second electrodes through a matching circuit, the RF power supply and the matching circuit being connected by a line having a characteristic impedance of less than 50 ohms.

According to a third aspect of the present invention, there is provided a plasma processing method of processing a target object, using plasma, comprising the steps of:

placing the target object on a work table arranged in a process chamber;

supplying an inactive gas and a reactive gas into the process chamber from a gas spouting surface facing the work table, while exhausting the process chamber, such that the inactive gas is continuously supplied from inactive gas spouting holes formed substantially all over the gas spouting surface, and the reactive gas is supplied from reactive gas spouting holes, which are formed substantially all over the gas spouting surface and divided into a plurality of groups, by repeatedly scanning the groups in a time-sharing manner;

turning the inactive gas and the reactive gas into plasma by means of RF discharge in the process chamber; and subjecting the target object to a process, using the plasma.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
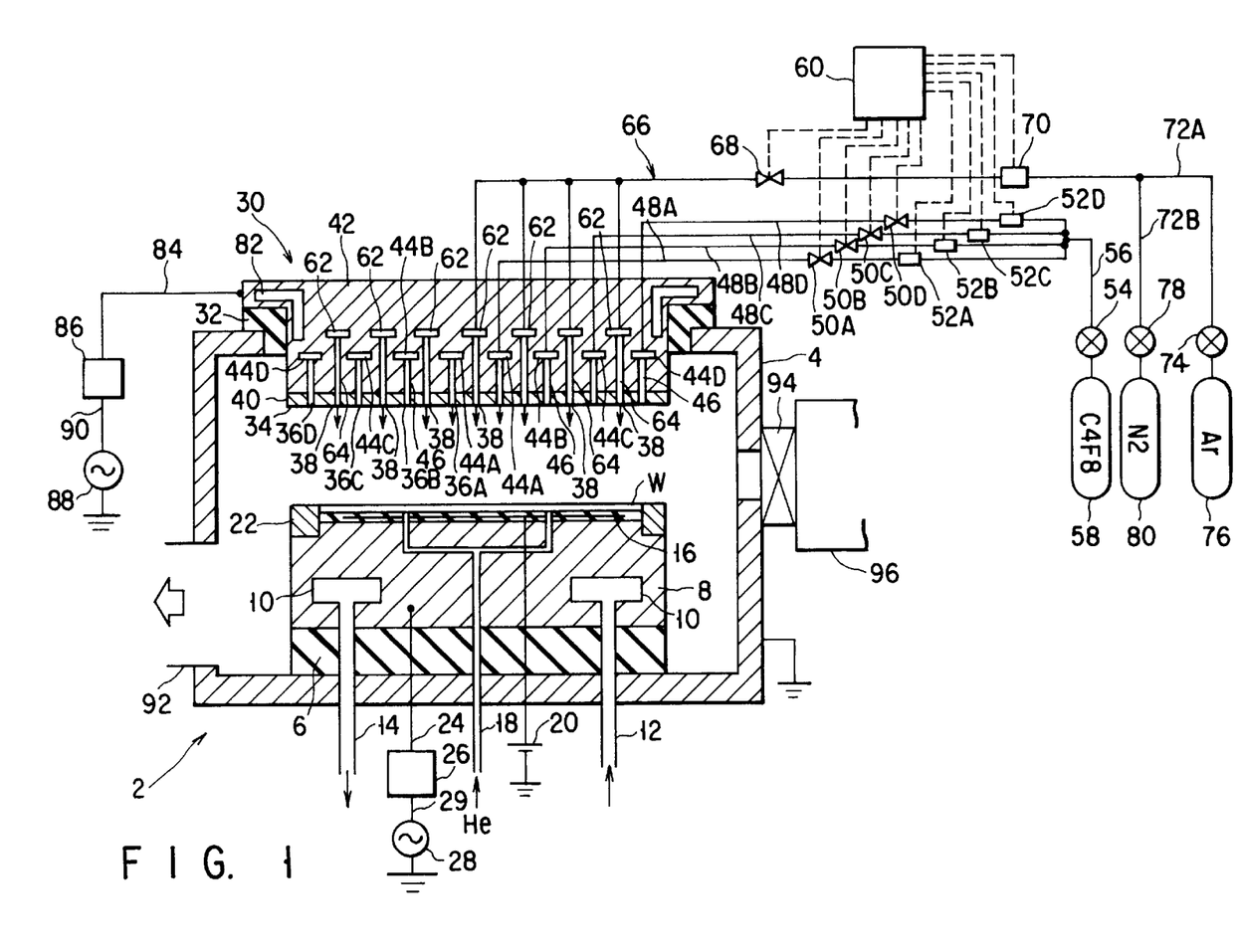
FIG. 1 is a structural view showing a plasma etching apparatus exemplifying a plasma processing apparatus according to an embodiment of the present invention.

FIG. 1 is a structural view showing a plasma etching apparatus 2 exemplifying a plasma processing apparatus according to an embodiment of the present invention.

The plasma etching apparatus 2 has an airtight process chamber 4 having a cylindrical shape and made of, e.g., aluminum, whose inner surface is anodized. The process chamber 4 defines an airtight process field and is grounded.

A susceptor 8 having a circular column shape is arranged via an insulating plate 6 made of, e.g., ceramics, on the bottom of the process field formed in the process chamber 4, for mounting a target object, such as a semiconductor wafer W. The susceptor 8 is made of, e.g, aluminum covered with the anodized surface. The diameter of susceptor 8 is set at, e.g, about 250 mm where the wafer W to be processed is 8 inches in size, while it is set at, e.g., about 410 mm where the wafer W is 300 mm in size.

A coolant room 10 is formed in the susceptor 8. A coolant for temperature adjustment, such as liquid fruolocarbon, is introduced in the coolant room 10 through a coolant supply pipe 12, so that the coolant is circulated in the coolant room 10. The cold of the coolant is transmitted from the coolant room 10 to the wafer W through the susceptor 8 to cool the wafer W. The heat-exchanged coolant is exhausted to the outside of the process field through a coolant exhaustion pipe 14.

A gas passage 18 is formed in the insulating plate 6, the susceptor 8, and an electrostatic chuck 16 described later, for supplying a heat medium, such as He gas, to the backside of the wafer W to be processed. A heat transmission passage is ensured by the heat medium from the susceptor 8 to the wafer W, so that the wafer W is kept at a predetermined temperature by the coolant.

The central portion of the top of the susceptor 8 is formed to be a projection of a circular plate shape, on which the electrostatic chuck 16 having a diameter almost the same as that of the wafer W is disposed. The electrostatic chuck 16 has a conductive layer interposed between two polyimide films. When a DC (direct current) voltage, such as 1.5 kV, is applied to the conductive layer from a high DC power supply 20 located outside the process chamber 4, the wafer W placed on the electrostatic chuck 16 is attracted and held there by a Coulomb' force. Where the conductive layer is interposed between two layers of alumina ceramics, in place of the polyimide films, it is possible to prevent problems, such as malfunction of breakdown voltage, from being caused, and thereby to prolong its life.

A focus ring 22 is arranged around the top of the susceptor 8 so as to surround the wafer W placed on the electrostatic chuck 16. The focus ring 22 is made of an insulating material to shut out an electric field. Since no reactive ions are accelerated above the focus ring 22, the reactive ions generated by plasma are effectively radiated onto the wafer W inside the ring 22.

An electric feeder rod 24 is connected to the susceptor 8 and penetrates the portion therebelow while keeping an insulated state. An RF (radio frequency) power supply 28, which outputs an RF power of, e.g., 13.56 MHz, is connected to the electric feeder rod 24 by a wiring line 29 through a matching circuit 26 including, e.g., a decoupling capacitor, so that a self bias can be applied to the susceptor 8 for attracting ions toward the wafer W.

Where the semiconductor wafer W is 8 inches in size, the impedance of the susceptor 8 relative to an RF power is about several ohms, and thus the characteristic impedance of the line 29 between the RF power supply 28 and the matching circuit 26 is set at about 50 ohms. However, where the wafer W is 300 mm in size, the surface area of the susceptor 8 grows several times larger, and the impedance of the susceptor 8 is greatly decreased in accordance with the increase in the surface area. As a result, if the characteristic impedance of the line 29 between the RF power supply 28 and the matching circuit 26 is set at 50 ohms where the wafer W is 300 mm in size, power loss or the like are increased by the resistor component of a reactor in the matching circuit 26.

For this reason, where the wafer W is 300 mm in size or a size larger than 300 mm, the characteristic impedance of the line 29 between the RF power supply 28 and the matching circuit 26 is set to be less than 50 ohms, so that the power loss in the reactor is suppressed. For example, where the susceptor 8 is used for the wafer W of 300 mm in size, the output impedance of the RF power supply 28 and the characteristic impedance of the line 29 are set to be from about 20 ohms to about 30 ohms.

A circular shower head 30 used as an upper electrode as well is supported by and fixed to the ceiling of the process chamber 4 through an insulating member 32. The shower head 30 has a bottom surface or gas spouting surface 34, which faces the upper surface of the susceptor 8 in parallel with a distance of from 20 mm to 40 mm therebetween. A number of reactive gas spouting holes 36 and a number of inactive gas spouting holes 38 are formed on the gas spouting surface 34 facing the susceptor 8.

The shower head 30 includes an electrode plate 40 having the gas spouting surface 34, and a head body 42 supporting the electrode plate 40. The electrode plate 40 is made of a conductive material, such as SiC or amorphous carbon, while the head body 42 is made of a conductive material, such as aluminum covered with the anodized surface.

Figure 2:
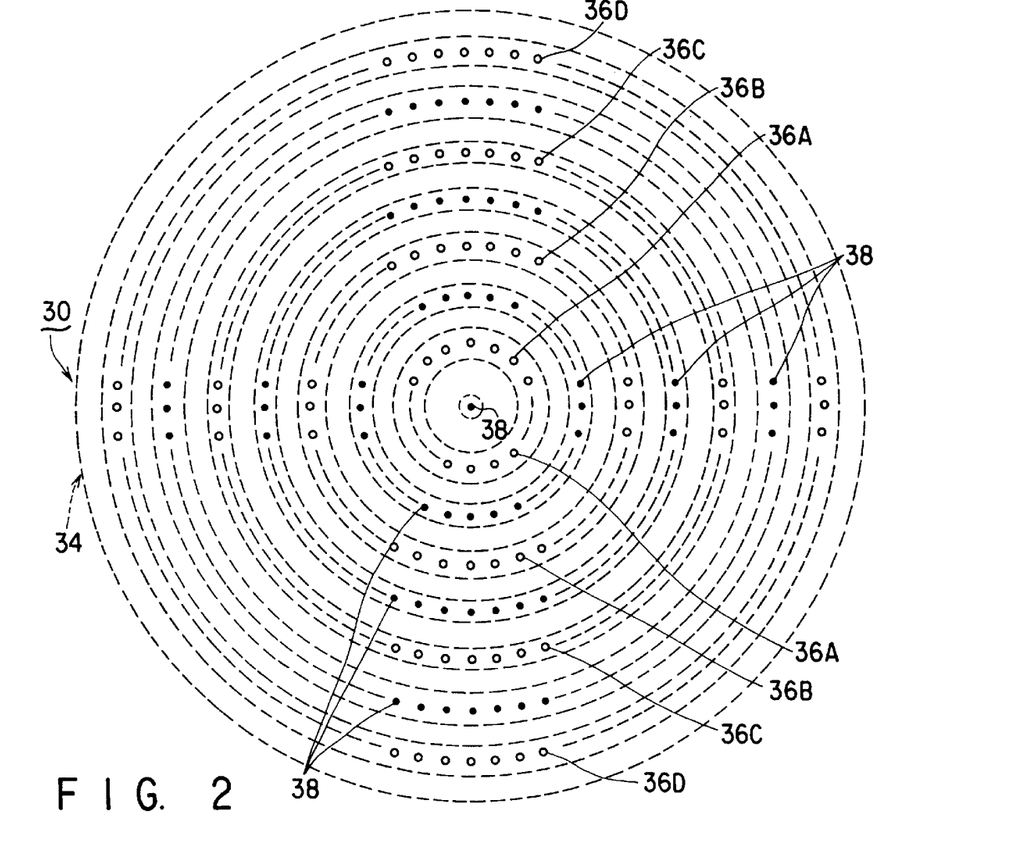
FIG. 2 is a plan view showing the gas spouting surface of a shower head used in the apparatus shown in FIG. 1.

FIG. 2 is a plan view showing the gas spouting surface 34 of the shower head 30. As shown in FIG. 2, the inactive gas spouting holes 38 and the reactive gas spouting holes 36 are coaxially arranged in this embodiment. The inactive gas spouting holes 38 and the reactive gas spouting holes 36 are alternately arranged in radial directions of the circular shower head 30. In FIG. 2, the inactive gas spouting holes 38 are indicated with black dots while the reactive gas spouting holes 36 are indicated with white dots.

More specifically, the reactive gas spouting holes 36 are divided into a plurality of groups coaxially arranged, e.g., four groups in the embodiment. The inactive gas spouting holes 38 are coaxially arranged between the coaxial groups of the reactive gas spouting holes 36. The groups of the reactive gas spouting holes 36 are identified as first (36A), second (36B), third (36C), and fourth (36D) groups from the central side as a matter of convenience.

Figure 3:
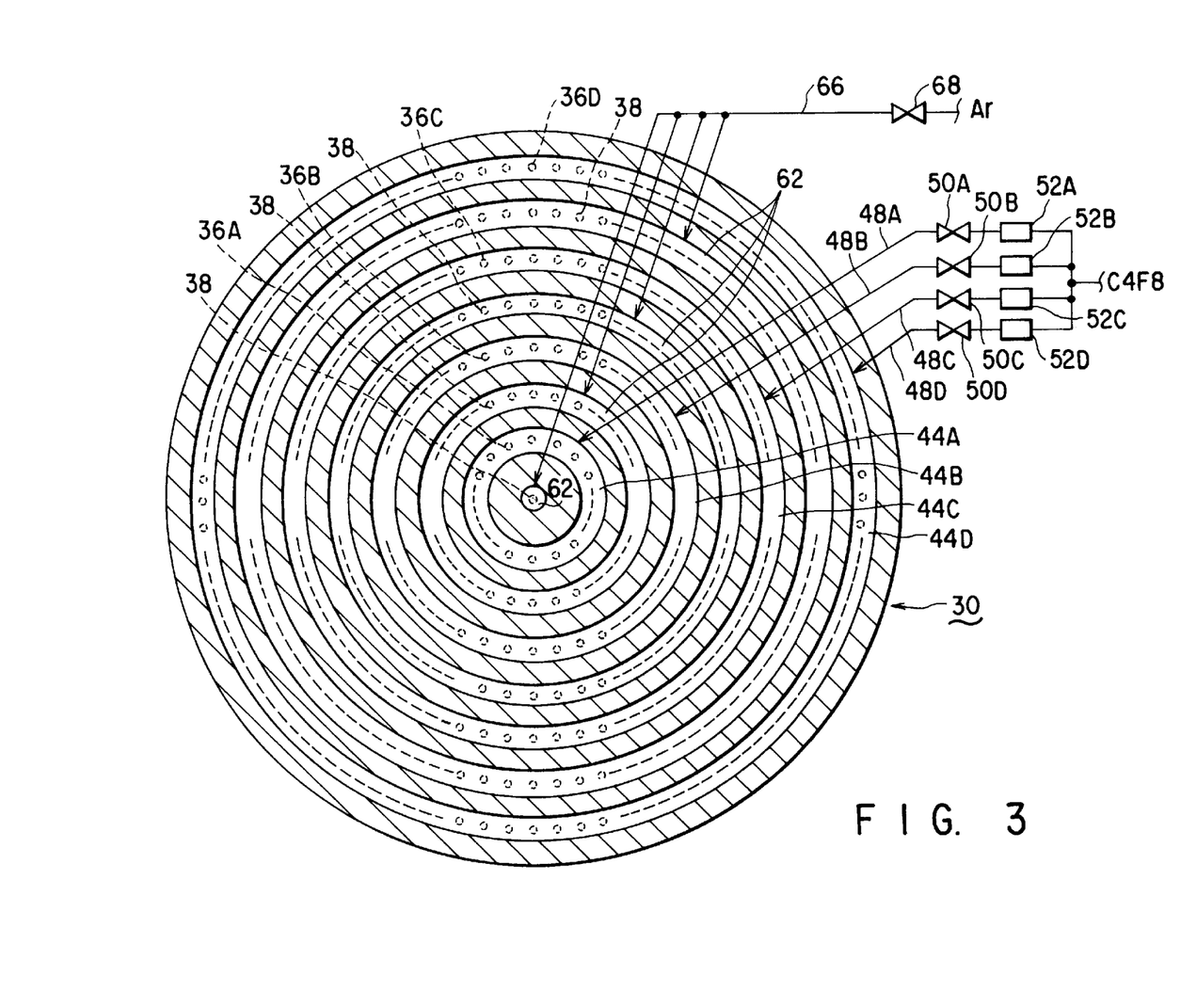
FIG. 3 is a cross-sectional plan view showing the shower head cut along reactive gas head grooves.

As shown in FIG. 3, the groups of the reactive gas spouting holes 36A to 36D respectively communicate with reactive gas head grooves 44A to 44D, which are coaxially formed in the head body 42 and independent from each other, through passages 46. FIG. 3 is a cross-sectional plan view showing the shower head 30 cut along the reactive gas head grooves 44A to 44D. The head grooves 44A to 44D respectively and independently communicate with reactive gas supply lines 48A to 48D. The gas supply lines 48A to 48D are respectively provided with time-sharing open/close valves 50A to 50D, which are formed of high speed valves, and with mass-flow controllers 52A to 52D.

The gas supply lines 48A to 48D are combined into one line 56, which is connected to a process gas source 58 storing a reactive gas, such as $C_4F_8$ gas, and provided with an ordinarily open/close valve 54. As described later, the mass-flow controllers 52A to 52D and the time-sharing open/close valves 50A to 50D are controlled by a gas supply control section 60, such as a micro-computer. In particular, the time-sharing open/close valves 50A to 50D are independently controlled over their open/close operation, i.e, start and stop of gas supply, in a time-sharing manner.

The inactive gas spouting holes 38 coaxially arranged as described above communicate with four inactive gas head grooves 62, which are coaxially formed in the head body 42, through passages 64. The four inactive gas head grooves 62 are connected to one inactive gas supply line 66 in common. The gas supply line 66 is divided into two lines 72A and 72B through an open/close valve 68 and a mass-flow controller 70. One of the lines 72A is connected to a gas source 76 storing an inactive gas, such as Ar gas, for initiating and uniformly keeping plasma, through an ordinarily open/close valve 74, while the other line 72B is connected to a gas source 80 storing an inactive gas, such as $N_2$ gas, for a purging operation, through an ordinarily open/close valve 80. The open/close valve 68 and mass-flow controller 70 are also controlled by the gas supply control section 60.

Figure 4:
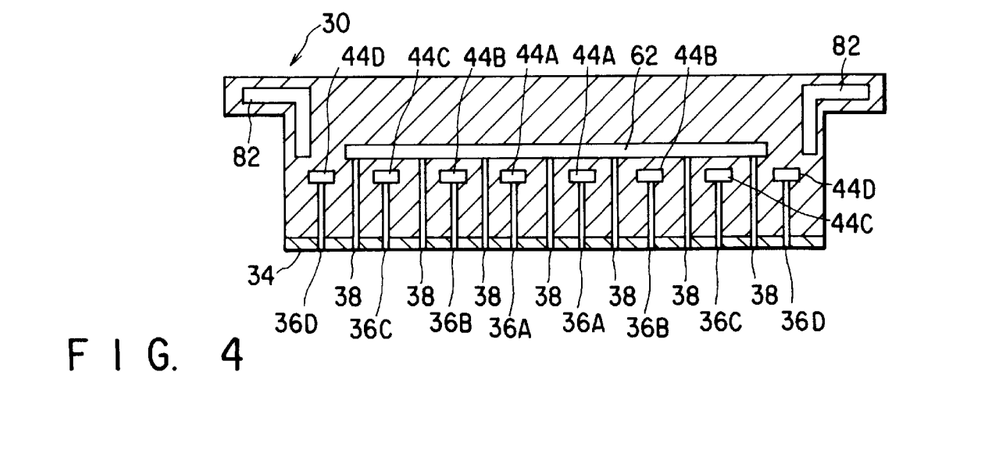
FIG. 4 is a cross-sectional side view showing a modification of the shower head.

Although the four inactive gas head grooves 62 are coaxially formed in this embodiment, another structure may be adopted to spout an inactive gas from the entirety of the gas spouting surface. For example, as shown in FIG. 4, an inactive gas head groove 62 formed of a circular thin bore may be used in place of the four inactive gas head grooves. Further, inactive gas head grooves may be arranged to radially extend from the center of the head body.

A coolant room 82 is formed in the head body 42. A coolant for temperature adjustment, such as liquid flurocarbon is introduced in the coolant room 82 through a coolant supply pipe (not shown), so that the coolant is circulated in the coolant room 82. The cold of the coolant is transmitted from the coolant room 82 to the electrode plate 40 to cool the electrode plate down to a predetermined temperature. The heatexchanged coolant is exhausted to the outside of the process field through a coolant exhaustion pipe (not shown). The electrode plate 40 is set at a temperature higher than that of the surface of the wafer W, such that radicals are directed to the wafer W and are not deposited on the surface of the electrode plate 40.

The shower head 30 having the above described structure is easily manufactured by dividing it into a plurality of blocks.

An electric feeder rod 84 is connected to the head body 42. An RF power supply 88, which outputs an RF power of, e.g., 13.56 MHz, for generating plasma is connected to the electric feeder rod 84 by a wiring line 90 through a matching circuit 86 including, e.g., a decoupling capacitor.

Where the wafer W is 8 inches in size, the characteristic impedance of the line 90 between the RF power supply 88 and the matching circuit 86 is set at about 50 ohms, as on the susceptor side. However, the impedance on the upper electrode (head) side is decreased in accordance with an increase in the surface area of the wafer W. For this reason, where the wafer W is 300 mm in size or a size larger than 300 mm, the characteristic impedance of the line 90 between the RF power supply 88 and the matching circuit 86 is set to be less than 50 ohms. For example, where the wafer W is 300 mm in size, the output impedance of the RF power supply 88 and the characteristic impedance of the line 90 are set to be from about 20 ohms to about 30 ohms.

In other words, where the wafer W has a larger size and the impedance on the susceptor 8 side is decreased, the impedance of the line 90 on the head 30 side is set to be lower. By doing so, impedance matching is obtained between the susceptor and head sides, thereby suppressing power loss.

An exhaustion pipe 92 communicating with vacuum exhausting means (not shown), such as a turbo molecular pump, is connected to a side wall of the process chamber 4. The process field in the process chamber 4 can be vacuum exhausted down to a predetermined decreased pressure by the exhausting means.

A load lock chamber 96 is connected to a side wall of the process chamber 4 through a gate valve, which can be hermetically opened and closed. The wafer W to be processed is transferred between the process chamber 4 and the load lock chamber 96 by a transfer means (not shown), such as a transfer arm, arranged in the load lock chamber 96.

An explanation will be given in relation to an operation of the plasma etching apparatus 2 having the above described structure. It will be assumed that a silicon oxide film on a wafer having a silicon substrate is to be etched, using the plasma etching apparatus 2.

At first, a wafer W to be processed is transferred by the transfer means from the load lock chamber 96 to the process chamber 4 and is mounted onto the electrostatic chuck 16, after the gate valve 94 is opened. The wafer W is attracted and held on the electrostatic chuck 16 by applying a power from the DC power supply 20. Then, the process chamber 4 is vacuum-exhausted by the exhausting means after the transfer means is retreated to the load lock chamber 96.

Meanwhile, the ordinarily open/close valve 54 is opened and the time-sharing open/close valves 50A to 50D are opened and closed in a time-sharing manner, so that $C_4F_8$ gas is supplied from the process gas source 58 while its flow rate is controlled by the mass-flow controllers 52A to 52D. Further, the open/close valves 68 and 74 are opened, so that Ar gas is supplied from the Ar gas source 76 while its flow rate is controlled by the mass-flow controller 70.

The Ar gas for initiating and uniformly keeping plasma reaches the shower head 30 through the inactive gas supply line 66, and flows into the inactive gas head grooves 62 coaxially arranged. Then, the Ar gas is supplied into the processing space between head 30 and susceptor 8, through the passages 64 and the inactive gas spouting holes 38 arranged all over the gas spouting surface 34.

On the other hand, the $C_4F_8$ gas used as a reactive gas for etching flows into the reactive gas head grooves 44A to 44D through the respective reactive gas supply lines 48A to 48D. Then, the $C_4F_8$ gas is supplied into the processing space through the passages 46 and the groups of the reactive gas spouting holes 36A to 36D in a time-sharing manner.

While the Ar gas and $C_4F_8$ gas are supplied, the process chamber 4 is exhausted, so that inside of the process chamber is kept at a predetermined pressure of, e.g., about 1 Pa.

Under such conditions, an RF power for generating plasma is applied to the shower head 30 from the RF power supply 88 and an RF power for self-bias is applied to the susceptor 8 from the RF power supply. By doing so, the gases are turned into plasma by an electric field generated between the susceptor 8 and the shower head 30, so that a layer of, e.g., $SiO_2$ on the wafer W is etched by the plasma. During etching, the susceptor 8 and the shower head 30 are cooled down to a predetermined temperature by a coolant flowing therein.

The least amount of Ar gas for initiating and uniformly keeping plasma is continuously supplied into the process space from all the inactive gas spouting holes 38 during etching, so as to stably generate plasma all over the process space. In contrast, the reactive gas is supplied into the process space while the time sharing open/close valves 50A to 50D corresponding to the grooves, respectively, are opened and closed in a time-sharing manner by means of electric signals or pneumatic pressure under control of the gas supply control section 60. As a result, the amount of gas supplied per unit time is decreased, so that no problems arise where the exhausting performance is limited.

In other words, the residence time of the gas per unit area in the process space in the case of processing a 300-mm (12-inch) wafer can be almost the same as that in the case of processing an 8-inch wafer, without changing the exhausting performance. It follows that planar uniformity of a plasma process can be high without a decrease in its processing rate.

Manners of supplying the reactive gas will be explained in detail.

Figure 5A:
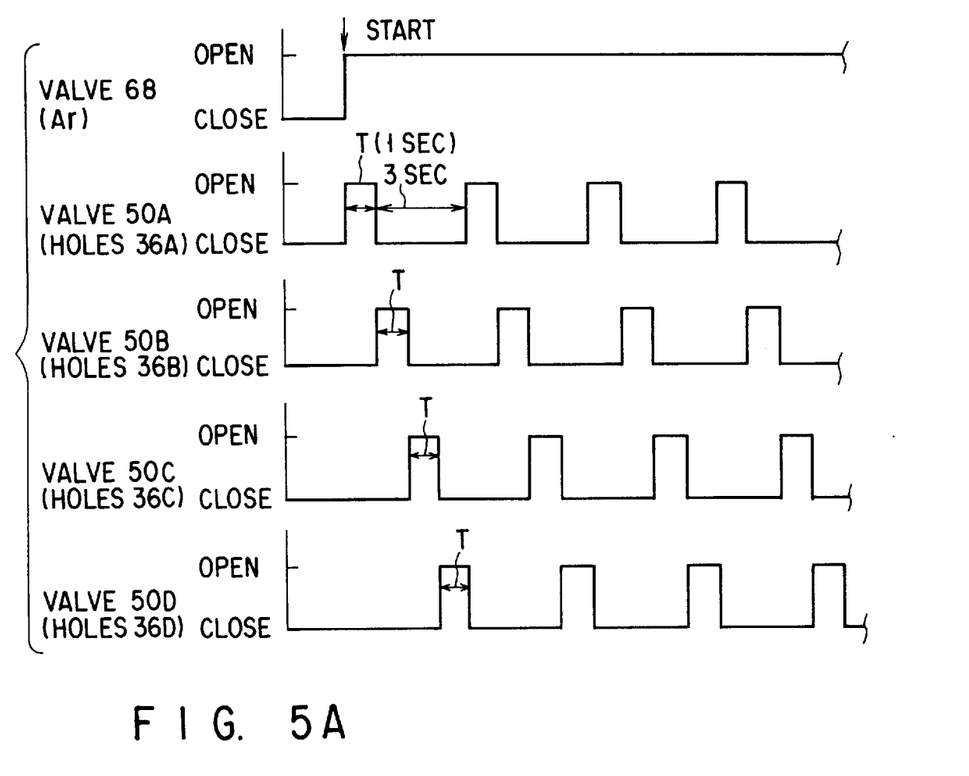
FIGS. 5A and 5B are a timing chart showing operation of valves and a view showing the order of spouting a reactive gas, respectively, in a first pattern of gas spouting.
Figure 5B:
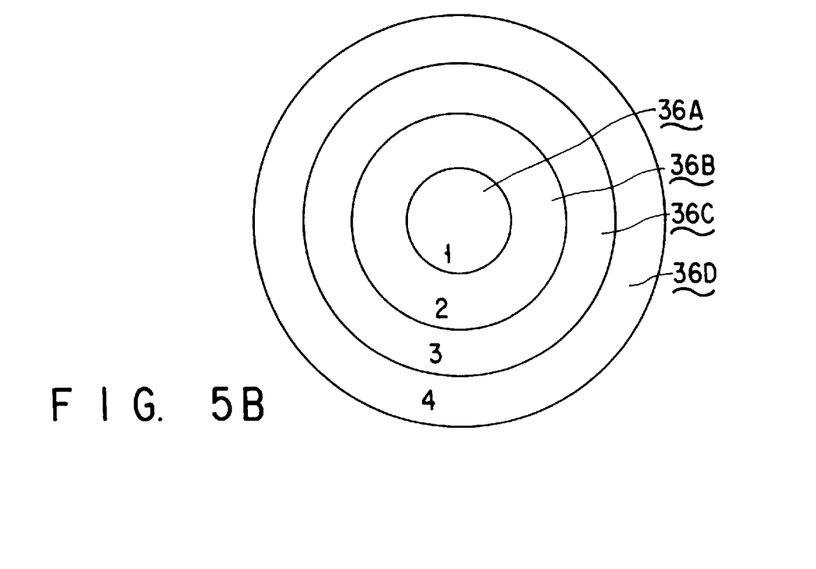

FIGS. 5A and 5B are a timing chart showing operation of valves and a view showing the order of spouting a reactive gas, respectively, in a first pattern of gas spouting. As shown in FIG. 5A, the open/close valve 68 for the Ar gas is continuously opened during etching so that the Ar gas is continuously supplied from the entirety of the gas spouting surface. In contrast, the time-sharing open/close valves 50A to 50D are repeatedly opened and closed to supply the reactive gas in a time-sharing manner, such that, e.g., each valve is opened for a period of time T of 1 second at intervals of 3 seconds. In this case, as shown in FIG. 5B, the groups of reactive gas spouting holes 36A to 36 D are repeatedly scanned from the center to the periphery in the sequential order of the first group (36A), second group (36B), third group (36C) and fourth group (36D).

Note that the numerals in FIG. 5 indicate the order of supplying the reactive gas. Since the inactive gas is continuously supplied overall, it is not indicated in FIG. 5B. In the following drawings, this indication manner will be also adopted. Intervals and flow rates of the time-sharing open/close valves of the respective groups are optimized in consideration of parameters, such as etching rate, etching selectivity, etched shaped, and process uniformity.

Figure 6A:
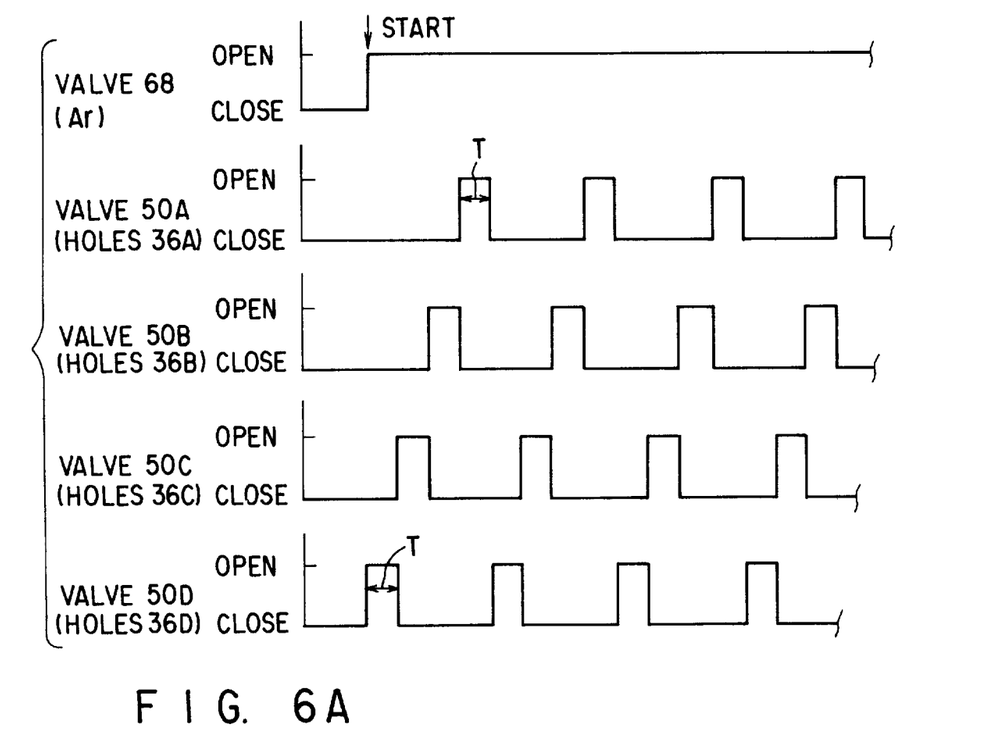
FIGS. 6A and 6B are a timing chart showing operation of valves and a view showing the order of spouting a reactive gas, respectively, in a second pattern of gas spouting.
Figure 6B:
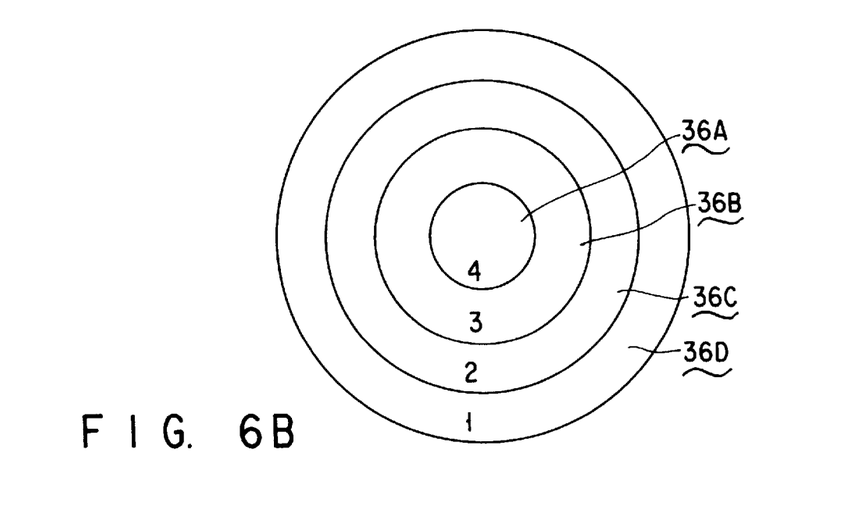

FIGS. 6A and 6B are a timing chart showing operation of valves and a view showing the order of spouting a reactive gas, respectively, in a second pattern of gas spouting.

In the second pattern, an operation reverse to that of the first pattern is carried out. Namely, in this case, the groups of reactive gas spouting holes 36A to 36D are repeatedly scanned from the periphery to the center in the sequential order of the fourth group (36D), third group (36C), second group (36B) and first group (36A).

Figure 7A:
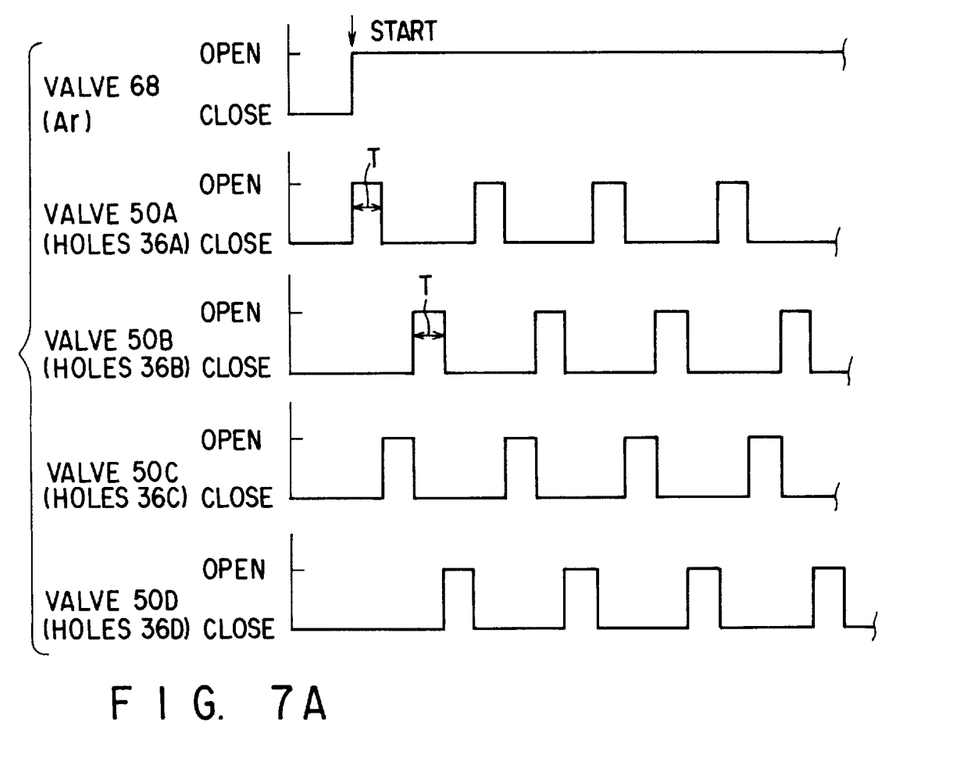
FIGS. 7A and 7B are a timing chart showing operation of valves and a view showing the order of spouting a reactive gas, respectively, in a third pattern of gas spouting.
Figure 7B:
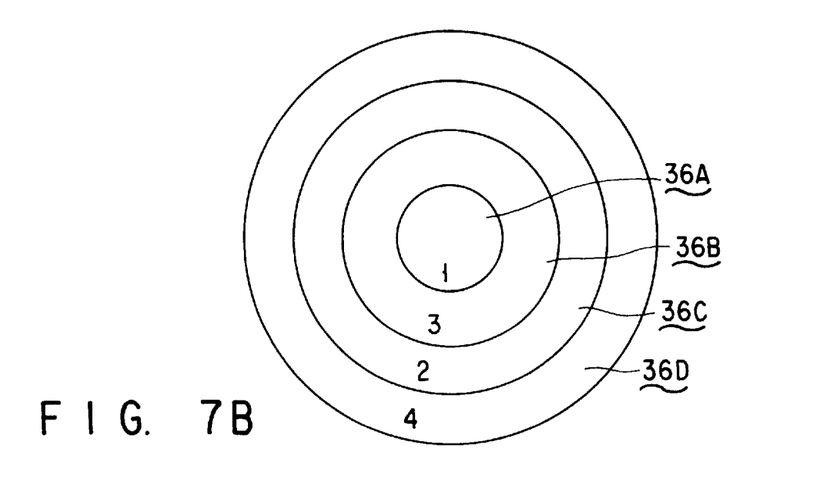

FIGS. 7A and 7B are a timing chart showing operation of valves and a view showing the order of spouting a reactive gas, respectively, in a third pattern of gas spouting. the reactive gas spouting holes may be divided into a plurality of groups other than four groups, so as to supply and stop the reactive gas in a time-sharing manner.

Further, the present invention is not limited to a coaxial arrangement of the gas spouting holes as shown in this embodiment. Other arrangements may be adopted, as far as the reactive gas can be supplied in a time-sharing manner.

Figure 9:
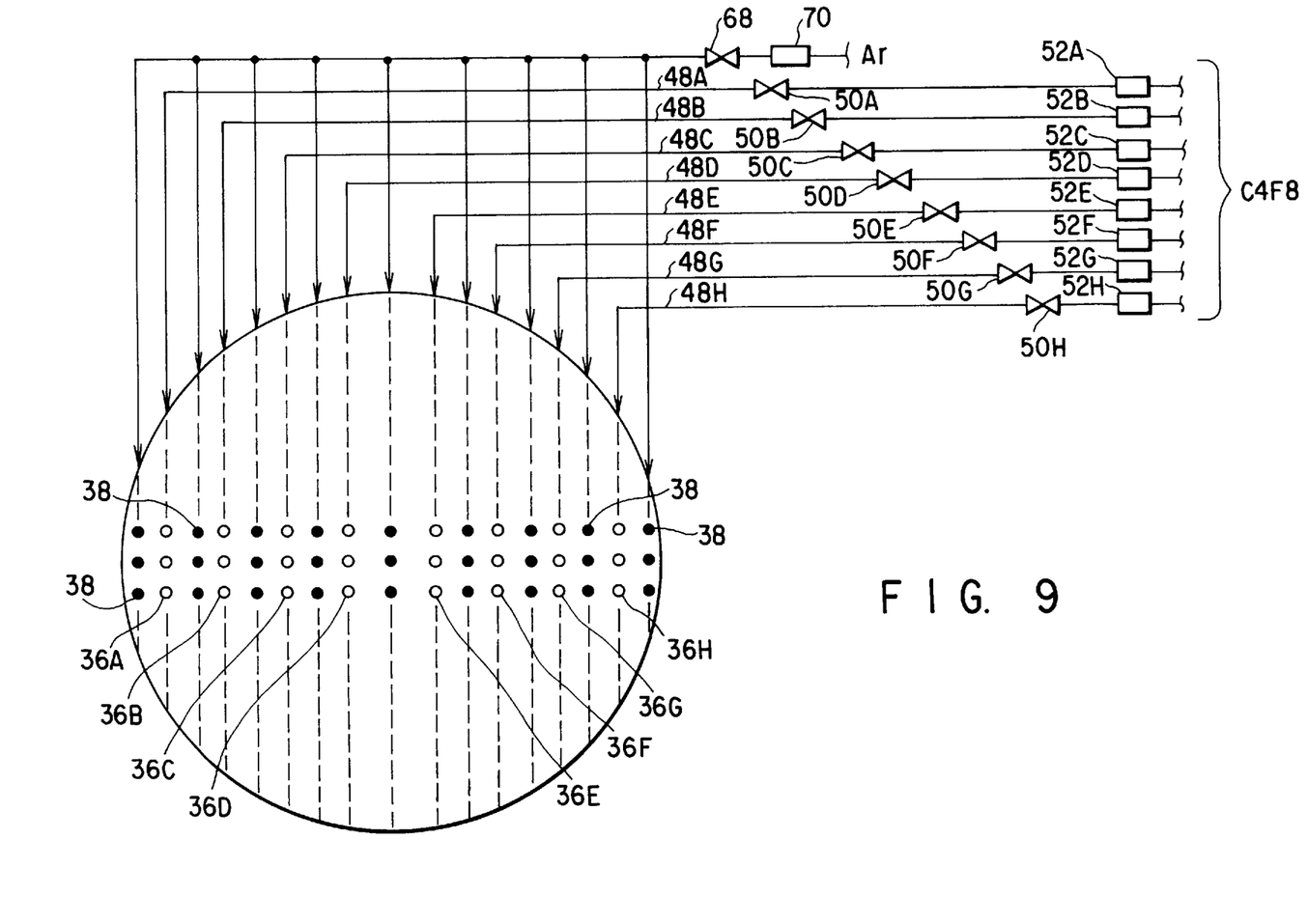
FIG. 9 is a structural view showing a shower head according to another embodiment of the present invention.

FIG. 9 is a structural view showing a shower head having a gas spouting surface on which groups of gas spouting holes are linearly arranged. In FIG. 9, the inactive gas spouting holes 38 are indicated with black dots while the reactive gas spouting holes 36 are indicated with white dots.

The gas spouting holes 36 and 38 are linearly arrayed in longitudinal directions in FIG. 9, and the reactive gas spouting holes 36 and the inactive gas spouting holes 38 are alternately arrayed in latitudinal directions. The reactive gas spouting holes are divided into eight groups (36A to 36H) in accordance with the longitudinal arrays in FIG. 9. The eight groups (36A to 36H) respectively communicate with reactive gas supply lines 48A to 48H respectively provided with time-sharing open/close valves 50A to 50H and mass-flow controllers 52A to 52H, which are respectively and independently controlled.

In the third pattern, the reactive gas is supplied such that the coaxial groups of the reactive gas spouting holes are alternately selected, i.e., in a non-sequential order relative to the arrayed order of the groups. Namely, in this case, the groups of reactive gas spouting holes 36A to 36D are repeatedly scanned in the non-sequential order of the first group (36A), third group (36C), second group (36B) and fourth group (36D).

Figure 8A:
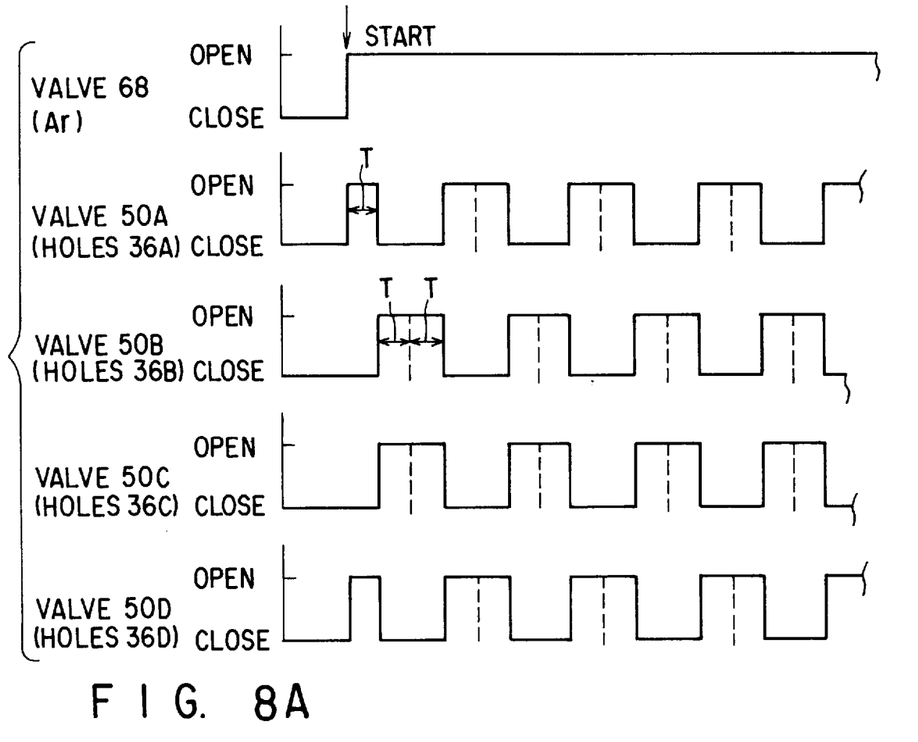
FIGS. 8A and 8B are a timing chart showing operation of valves and a view showing the order of spouting a reactive gas, respectively, in a fourth pattern of gas spouting.
Figure 8B:
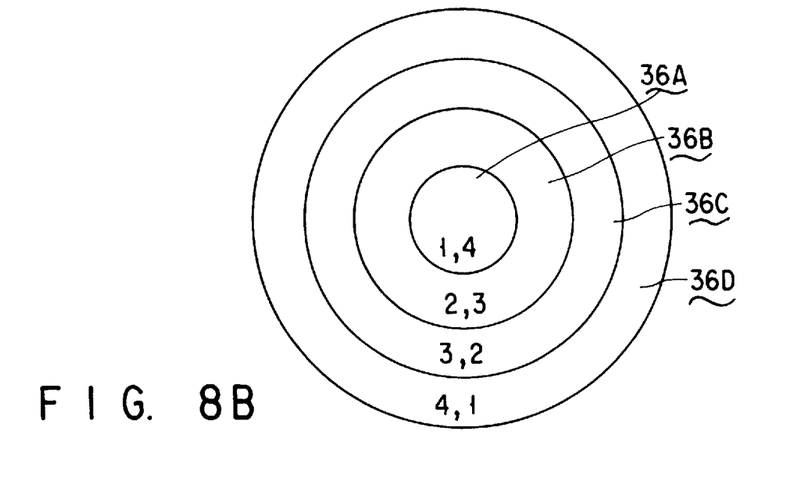

FIGS. 8A and 8B are a timing chart showing operation of valves and a view showing the order of spouting a reactive gas, respectively, in a fourth pattern of gas spouting.

In the fourth pattern, the reactive gas is supplied such that the inward scanning and the outward scanning of the coaxial groups of reactive gas spouting holes are concurrently performed. Namely, in this case, the groups of reactive gas spouting holes 36A to 36D are repeatedly scanned in the order of the first and fourth groups (36A and 36D), second and third groups (36B and 36C), third and second groups (36C and 36B), and fourth and first groups (36D and 36A). In other words, the reactive gas is supplied from the two groups of the reactive gas spouting holes at each time.

As an example, the reactive gas spouting holes are divided into four groups in this embodiment. Instead, The time-sharing open/close valves 50A to 50H are controlled to open and close in a predetermined order and in a time-sharing manner, so that the reactive gas is supplied in units of a group and in a time-sharing manner. In this case, the least amount of the inactive gas for initiating and uniformly keeping plasma is also continuously supplied from the entirety of the gas spouting surface.

Figure 10A:
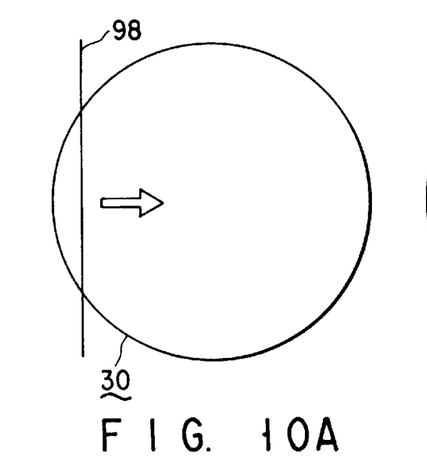
FIGS. 10A and 10B are views showing different patterns of gas spouting, which are performed with the shower head shown in FIG. 9.
Figure 10B:
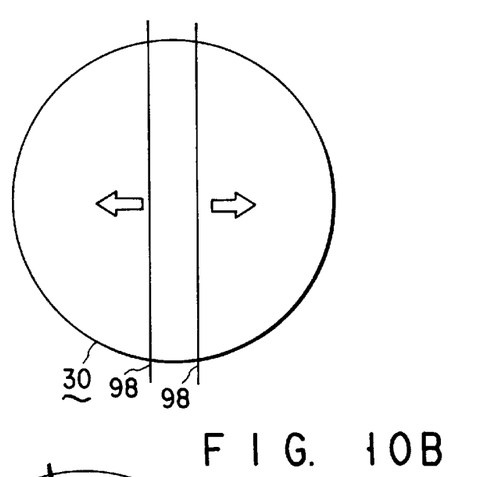

FIGS. 10A and 10B are views showing different patterns of gas spouting, which are performed with the shower head shown in FIG. 9. In the pattern shown in FIG. 10A, a line 98 representing a selected and gas spouting state of each group of the reactive gas spouting holes 36 is horizontally moved in parallel from one end toward the center of the head. In the pattern shown in FIG. 10B, two lines 98 are horizontally moved in parallel from the center of the head toward right and left ends.

Figure 11:
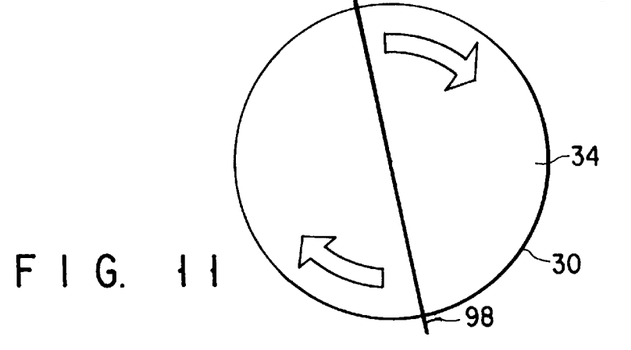
FIG. 11 is an explanatory view showing a manner of forming groups of reactive gas spouting holes according to still another embodiment of the present invention.
Figure 12:
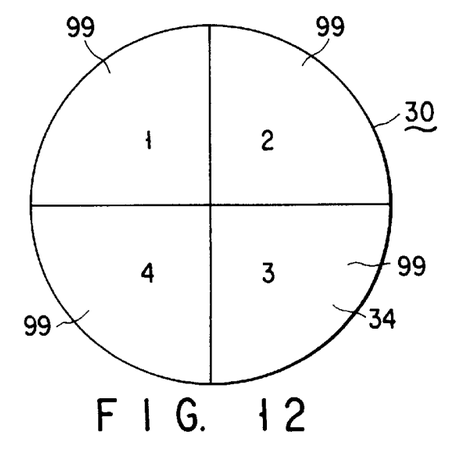
FIG. 12 is an explanatory view showing a manner of forming groups of reactive gas spouting holes according to still another embodiment of the present invention.
Figure 13:
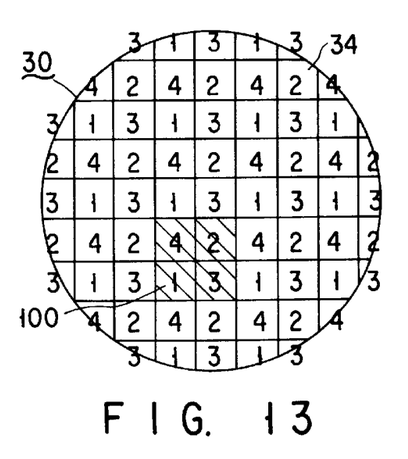
FIG. 13 is an explanatory view showing a manner of forming groups of reactive gas spouting holes according to still another embodiment of the present invention.

Further, in the present invention, it is possible to design groups of reactive gas spouting holes to be selected in a time-sharing manner, as shown in FIGS. 11 to 13. In FIGS. 12 and 13, the numerals "1" to "4" indicate the order of spouting the reactive gas.

In the embodiments shown in FIGS. 11 to 13, the number of reactive gas spouting holes selected at the same time to spout the gas is constant, i.e, the respective numbers of selected holes are the same. In this case, the least amount of the inactive gas for initiating and uniformly keeping plasma is also continuously supplied from the entirety of the gas spouting surface.

In a shower head 30 shown in FIG. 11, a line 98 representing a selected and gas spouting state of each group of reactive gas spouting holes 36 is rotated about the center of a gas spouting surface 34, so that the groups of reactive gas spouting holes are selected in a time-sharing manner.

In a shower head 30 shown in FIG. 12, a gas spouting surface 34 is essentially uniformly divided into a plurality of regions, such as four groups 99, in an angular direction. A number of reactive gas spouting holes belonging to each region 99 constitute one group. The groups are selected in a time-sharing manner.

In a shower head 30 shown in FIG. 13, a gas pouting surface 34 is essentially uniformly divided into a plurality of regions 100 arrayed in a matrix format. In FIG. 13, a single region 100 is indicated with hatching. Each one of groups of reactive gas spouting holes to be selected in a time-sharing manner, such as four groups, has one spouting hole in every region 100.

Note that in place of $C_4F_8$ used as the reactive gas in the above described embodiments, other CF-based gas, such as $CH_4$, $CHF_3$, $CH_2F_2$, $CH_3F$, $C_2F_6$, $C_2H_2F_2$, or $C_3F_3$, may be used. CO and $O_2$ may be included in the reactive gas. Further, the reactive gas may be diluted with an inactive gas, such as Ar gas. On the other hand, in place of Ar gas used as the inactive gas for initiating and uniformly keeping plasma, other inactive gas, such as He, Xe, or Kr gas, may be used.

Further, in place of a plasma processing apparatus In of the parallel plate type explained in the above described embodiments, the present invention may be applied to a plasma processing apparatus of another type, such as ICP type, or ECR type.

Furthermore, a plasma processing apparatus according to the present invention may be applied to a CVD, ashing, or sputtering apparatus other than an etching apparatus. As a target object to be processed other than a semiconductor wafer, an LCD substrate or the like is included.

With a plasma processing method and apparatus, the following advantages are obtained.

The least amount of an inactive gas for initiating and uniformly keeping plasma is continuously supplied during a process to make plasma density uniform, while a reactive gas is supplied in a time-sharing manner to scan the entirety of a gas spouting surface in a predetermined pattern, so that the gas flow rate per unit time is decreased as a whole.

As a result, even where a target object has a large surface area, a high vacuum level and a gas residence time per unit surface area in a process space can be ensured sufficiently to perform a plasma process. It follows that a plasma process can be performed at a high planar uniformity and a high processing rate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A plasma etching processing method of etching a target object, using plasma, comprising the steps of:

placing said target object on a work table arranged in a process chamber;

supplying an inactive gas and a reactive gas into said process chamber from a gas spouting surface facing said work table, while exhausting said process chamber, such that said inactive gas is continuously supplied from a number of inactive gas spouting holes formed on said gas spouting surface, and said reactive gas is supplied from reactive gas spouting holes, which are formed on said gas spouting surface and divided into a plurality of groups, by intermittently opening and closing said groups in a time-sharing manner;

turning said inactive gas and reactive gas into plasma by means of RF discharge in said process chamber; and etching said target object, using said plasma.

2. The method according to claim 1, wherein said inactive gas spouting holes and said reactive gas spouting holes are alternately arranged in a direction.

3. The method according to claim 1, wherein said groups of said reactive gas spouting holes have an equal number of holes.

4. The method according to claim 1, wherein said groups of said reactive gas spouting holes are selected to supply said reactive gas in a sequential order relative to an arrayed order of said groups.

5. The method according to claim 1, wherein said groups of said reactive gas spouting holes are selected to supply said reactive gas in a non-sequential order relative to an arrayed order of said groups.

* * * * *